United States Patent [19]

Dery et al.

[11] Patent Number: 4,640,981
[45] Date of Patent: Feb. 3, 1987

[54] ELECTRICAL INTERCONNECTION MEANS

[75] Inventors: Ronald A. Dery; Warren C. Jones, both of Winston-Salem, N.C.

[73] Assignee: AMP Incorporated, Harrisburg, Pa.

[21] Appl. No.: 765,625

[22] Filed: Aug. 14, 1985

Related U.S. Application Data

[62] Division of Ser. No. 657,851, Oct. 4, 1984.

[51] Int. Cl.[4] .......................... H01R 4/00; H01B 7/08
[52] U.S. Cl. ............................ 174/88 R; 174/117 FF; 174/117 PC; 174/117 A; 361/411
[58] Field of Search .......... 174/88 R, 117 A, 117 PC, 174/117 FF, 71 R, 72 C; 361/398, 411; 156/47, 51, 52; 29/830, 832, 846

[56] References Cited

U.S. PATENT DOCUMENTS

| | | | |
|---|---|---|---|
| Re. 31,411 | 10/1983 | Bolon et al. ........................ | 252/501.1 |
| 2,808,352 | 10/1957 | Coleman et al. ..................... | 428/560 |
| 3,391,246 | 7/1968 | Freeman et al. ............. | 174/117 FF |
| 3,514,326 | 5/1970 | Stow .................................... | 428/328 |
| 3,683,105 | 8/1972 | Shamash et al. ................. | 361/398 X |
| 3,704,164 | 11/1972 | Travis ........................ | 174/117 FF X |
| 3,762,946 | 10/1973 | Stow et al. ...................... | 174/117 A |
| 3,778,306 | 12/1973 | Stow .................................... | 428/335 |
| 4,088,801 | 5/1978 | Bolon et al. ........................ | 427/96 X |
| 4,113,981 | 9/1978 | Fujita et al. ......................... | 174/88 R |
| 4,243,455 | 1/1981 | Shiba et al. .......................... | 156/187 |
| 4,251,683 | 2/1981 | Oughton, Jr. et al. ... | 174/117 FF X |
| 4,368,281 | 1/1983 | Brummett et al. .................. | 523/458 |
| 4,401,686 | 8/1983 | Durand .............................. | 427/96 X |
| 4,401,843 | 8/1983 | Harper et al. ....................... | 174/72 B |
| 4,416,914 | 11/1983 | Eichelberger et al. ........... | 427/96 X |
| 4,423,435 | 12/1983 | Test, II .................................. | 357/65 |
| 4,425,263 | 1/1984 | Nazarenko .......................... | 252/511 |
| 4,433,887 | 2/1984 | Sado et al. .................... | 174/88 R X |
| 4,446,059 | 5/1984 | Eustice ................................ | 252/514 |
| 4,546,037 | 10/1985 | King .................................... | 428/323 |
| 4,548,862 | 10/1985 | Hartman ............................. | 428/323 |
| 4,554,033 | 11/1985 | Dery et al. .................... | 174/88 R X |

FOREIGN PATENT DOCUMENTS

| | | |
|---|---|---|
| 2831984 | 2/1979 | Fed. Rep. of Germany . |
| 111671 | 9/1979 | Japan ............................... 174/88 R |
| 155469 | 12/1979 | Japan ..................................... 427/96 |

OTHER PUBLICATIONS

"Tape Connectors?", Circuits Manufacturing, Mar. 1984, p. 24.
"Packaging News", Electronic Packaging & Production, Apr. 1984.
"Scotchlink Connector Tape" advertisement, Electronic Products, Aug. 15, 1984.

Primary Examiner—Arthur T. Grimley
Assistant Examiner—Morris H. Nimmo
Attorney, Agent, or Firm—Katherine A. Nelson

[57] ABSTRACT

An interconnecting means is comprised of one or more conductive ink conductors screen printed onto a first substrate, the conductive ink being comprised of an insulating polymer medium having first and second groups of conductive particles therein, and an insulating layer of flowable adhesive in covering relationship to the conductors. The first group of particles are finely divided particles which are suspended in the medium and form a continuous conductive path along the length of the conductor. The second group of particles are agglomerates of large particles which are randomly scattered throughout the conductive path and project above the surface of the medium. Interconnection is effected by positioning the first substrate conductors in an overlapping conducting relationship to the conductors on the second substrate such that the flowable adhesive is deposited between the two substrates and applying pressure to the positioned conductors and surrounding areas. The adhesive flows from the positioned areas, exposes the protruding agglomerates, thus bringing the agglomerates into contact and electrical interconnection with the second substrate conductors accompanied by the adhesion of the remaining first substrate surface to the surface of the second substrate.

20 Claims, 11 Drawing Figures

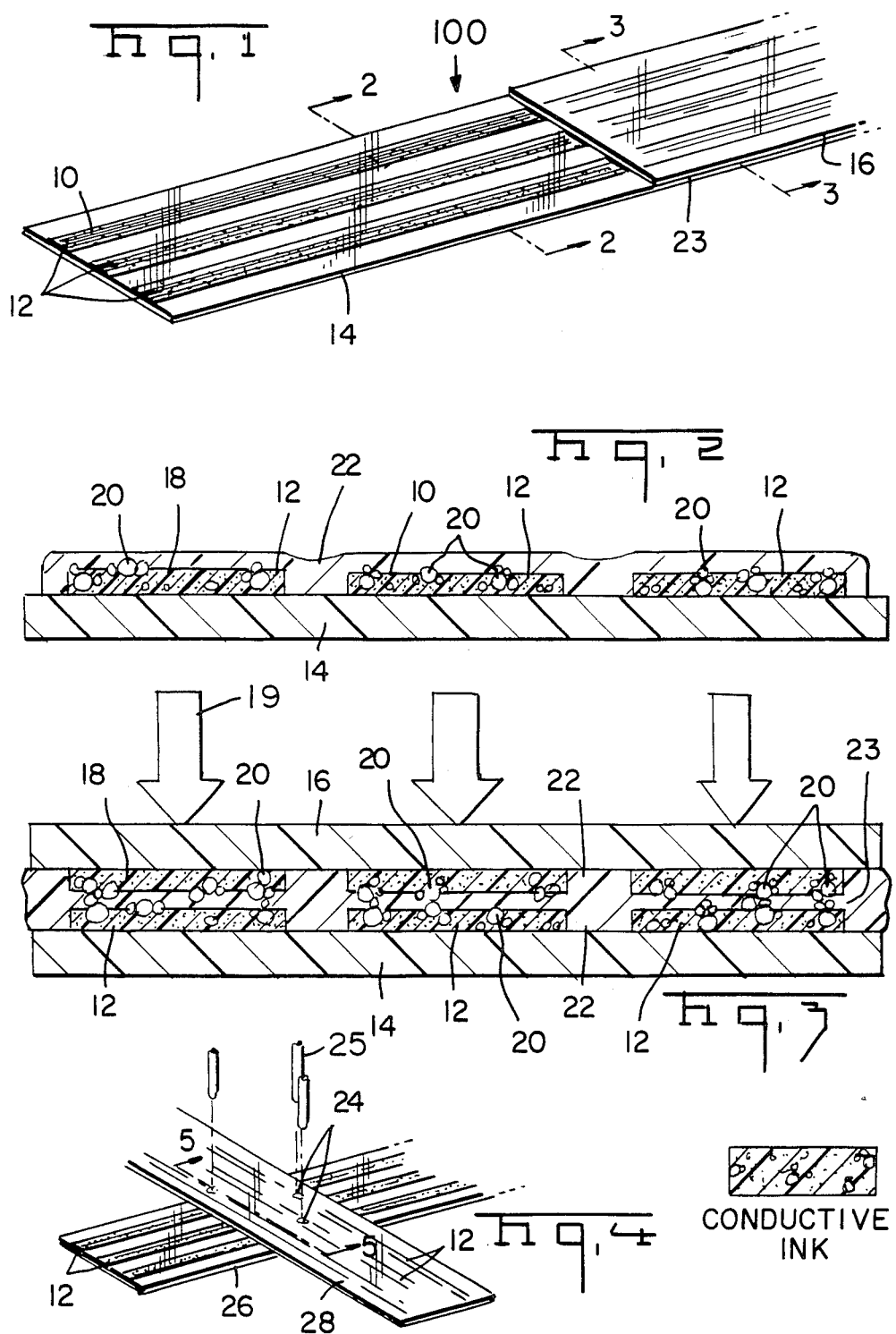

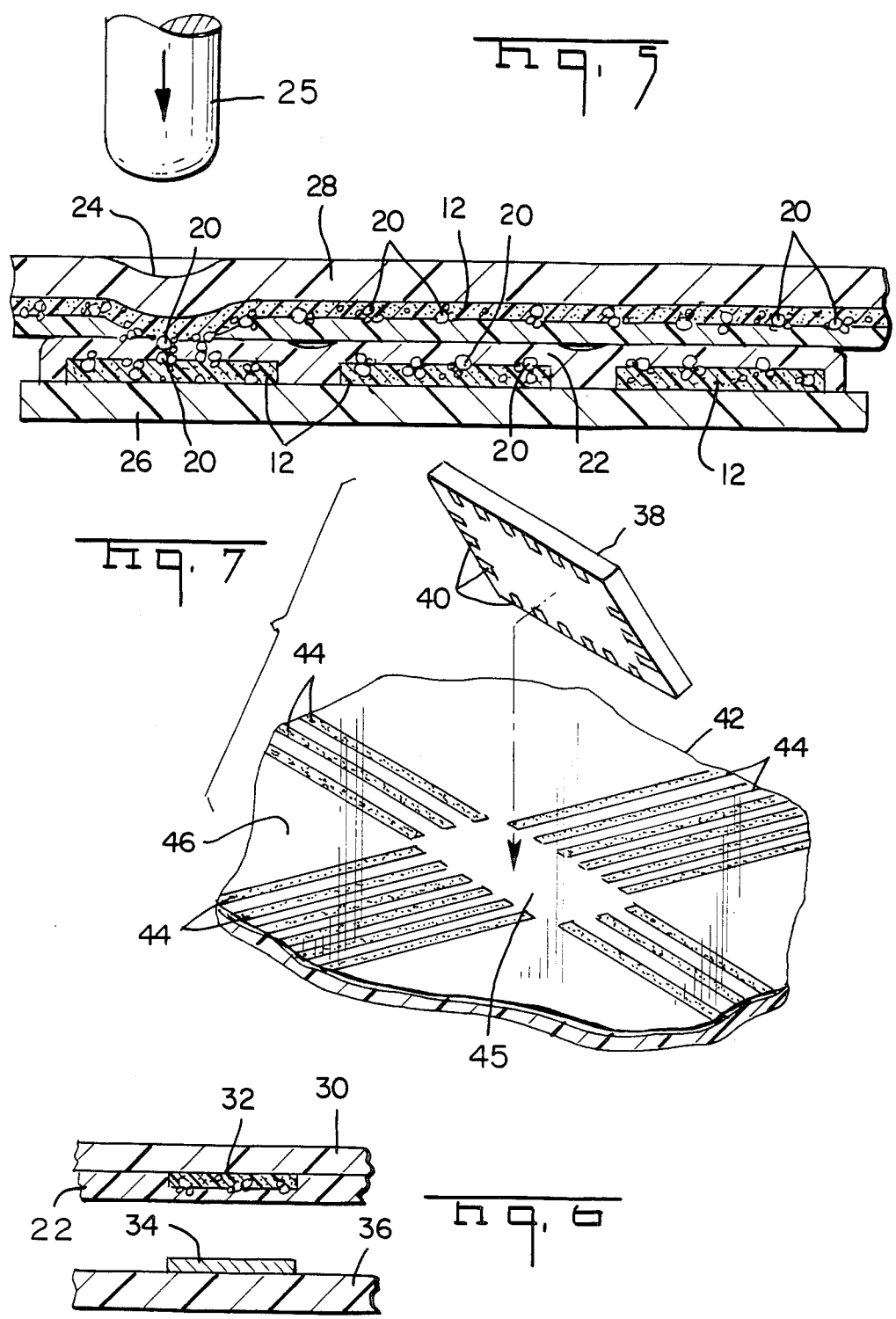

Fig. 10
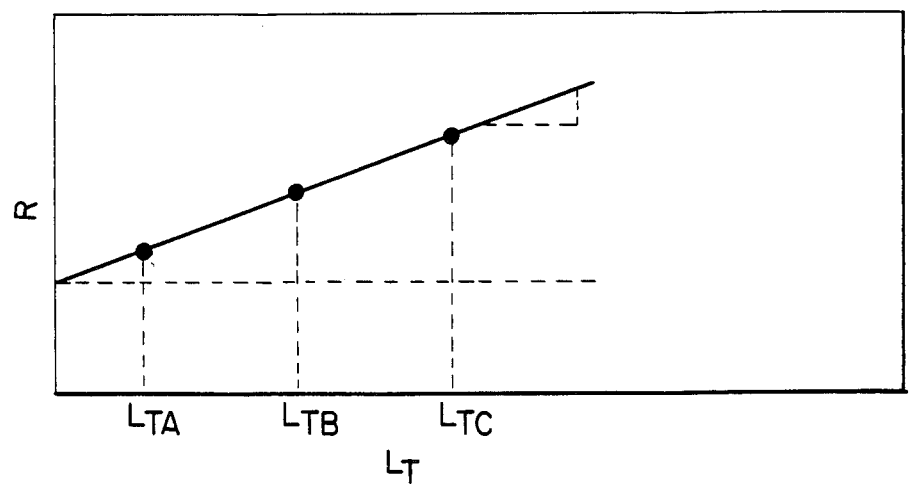
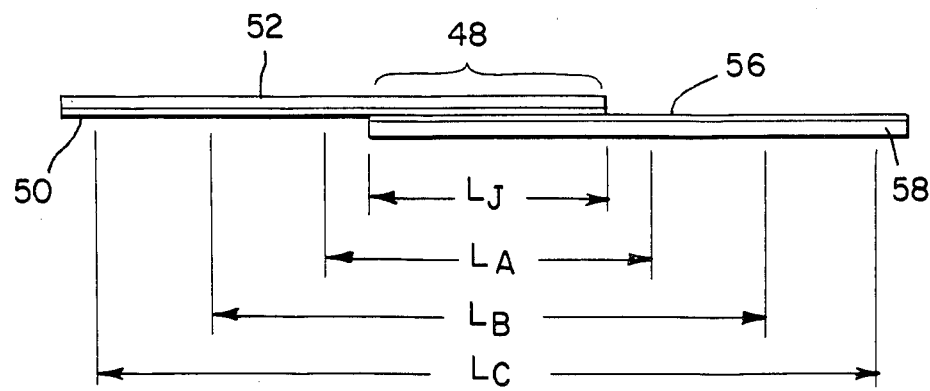
Fig. 11

ELECTRICAL INTERCONNECTION MEANS

This is a division of application Ser. No. 657,851 filed Oct. 4, 1984.

FIELD OF THE INVENTION

This invention is related to electrical connectors and in particular to adhesive based electrical interconnecting means.

BACKGROUND OF THE INVENTION

There is an ever-increasing need in the electronics industry for low profile and economical means for interconnecting electrical circuits. Traditionally, interconnecting means have required the use of housings, contact terminals, and in many cases, solder. Elastomeric connectors are also used, particularly for connecting components such as liquid crystal displays (LCDs). The present invention eliminates the need for housings, contact terminals, and solder for many applications. The invention also eliminates the need for elastomeric connectors and their associated pressure sustaining assemblies.

A large number of printed circuit boards, membrane switches, and the like are used by the electronic industry. Often the circuitry is screen printed onto the desired substrate. Screen printing is safer and simpler than etching or other printing techniques. Furthermore, it is more easily automated and more economical than other processes, particularly when used to print on flexible substrates.

The invention as disclosed herein provides a means for mechanically and electrically interconnecting conductive circuit traces or areas that have been screened on one substrate with desired conductive circuit traces or areas on a secnd substrate. It is not necessary that the conductive circuit traces or areas on the second substrate be screened thereon.

Means for interconnecting conductive circuit traces or areas on two substrates where neither substrate has screened circuitry is disclosed in our copending U.S. Pat. application *Adhesive Electrical Interconnecting Means* Ser. No. 657,717, filed 10/4/84.

Typical screenable conductive inks are comprised of finely divided particles of conductive materials having a major axis of approximately 15 micrometers in diameter and a minor axis of approximately 3 micrometers dispersed in a polymer medium comprised of a resin binder and solvent. In accordance with the invention, the basic conductive ink composition is modified by adding from about 1 percent to about 50 percent of large essentially spheroidal conductive filler particles, said particles ranging in mean size from about 15 micrometers to about 90 micrometers. Additional resin binder and solvent are also added to essentially preserve the resin-to-conductive-solids ratio of the ink base and screenable properties of the formulation. The large particles are randomly scattered throughout the medium as both individual and agglomerated particles. The resulting conductors are comprised of the polymer medium having a first group of finely divided particles and a second group of both individual and agglomerated large particles. The large particles are sufficiently large so that they will protrude from the surface of the modified conductive ink after it has been deposited on a substrate.

In accordance with the invention, the interconnecting means is made by screen printing the modified ink composition in the desired pattern onto a substrate. A layer of thermoplastic or heat activated adhesive is then deposited over the surface of the substrate and in particularly over the exposed surfaces of the inked areas which will be interconnected to conductive areas on another substrate. Interconnection is effected by positioning the desired areas in an overlapping conducting relationship such that the thermoplastic layer is disposed between the two conductive areas. Heat and pressure are applied to the positioned areas thus causing the thermoplastic layer to soften and flow from the positioned areas, and expose the protruding conductive particles or particle clusters which then interconnect said aligned conductive areas. Concomitantly, the surrounding areas of substrate are bounded by the adhesive.

The modified ink composition in accordance with the invention can be used on a variety of substrates, both firm and flexible. The composition can be screened in a variety of patterns. In one embodiment, the interconnection means is comprised of a continuous strip of flexible film having a plurality of parallel elongated modified conductive ink traces deposited thereon, the surfaces of said traces being essentially covered by dielectric thermoplastic adhesive to form a flexible cable connector. The flexible cable connector can be cut to length and adhered to a second substrate anywhere along its length since the interconnecting capability is built into the traces themselves.

The invention as disclosed herein is particularly useful for point-to-point matrix interconnections. Such interconnections can be made to any exposed conductive traces or areas or with other conductive areas having the ink traces in accordance with the invention.

Interconnecting means made in accordance with this invention offer connecting capabilities within the circuit path or area itself thus permitting direct connections between two surfaces without need for a housing. This is particularly advantageous when on glass with other non-crimpable surfaces. Furthermore, these interconnection means are particularly suitable for automatic assembly processes. In accordance with this invention these interconnecting means offer discrete and mass termination capabilities. If desired, the circuits can be terminated with standard connectors.

The interconnecting means disclosed herein can also be used for surface mounting electrical components to a substrate. The means is especially suitable for mounting leadless components to either flexible or firm substrates.

The use of the modified conductive ink formulation and interconnecting means can be understood by referring to the following drawings.

DESCRIPTION OF THE DRAWINGS

FIG. 1 is a perspective view of two sections of cable made in accordance with the invention and a lap joint between said two sections.

FIG. 2 is a cross-sectional view of the cable taken along the line 2—2 of FIG. 1.

FIG. 3 is a cross-sectional view of the lap joint taken along the line 3—3 of FIG. 1.

FIG. 4 is a perspective view ilustrating point-to-point matrix interconnections in accordance with the present invention.

FIG. 5 is a cross-sectional view of one matrix interconnection taken along the line 5—5 of FIG. 4.

FIG. 6 is a fragmentary cross-sectional view of the cable of FIG. 1 being interconnected to a circuit on a second substrate.

FIG. 7 is a fragmentary exploded perspective view illustrating surface mounting of a leadless component to a substrate by means of the invention.

FIG. 10 is a diagram of a graph plotting the total resistance through a length of lead-in conductive trace having the modified conductive ink a lap joint between two conductive traces joined by means of the invention disclosed herein, and a length of lead-out conductive trace of unmodified conductive ink, versus the combined trace length between the two measuring points but not contained in the lap joint.

FIG. 11 is a diagrammatic view of the lap joint described in FIG. 10 illustrating how the measurements were taken.

DETAILED DESCRIPTION OF THE INVENTION

Figure 8:
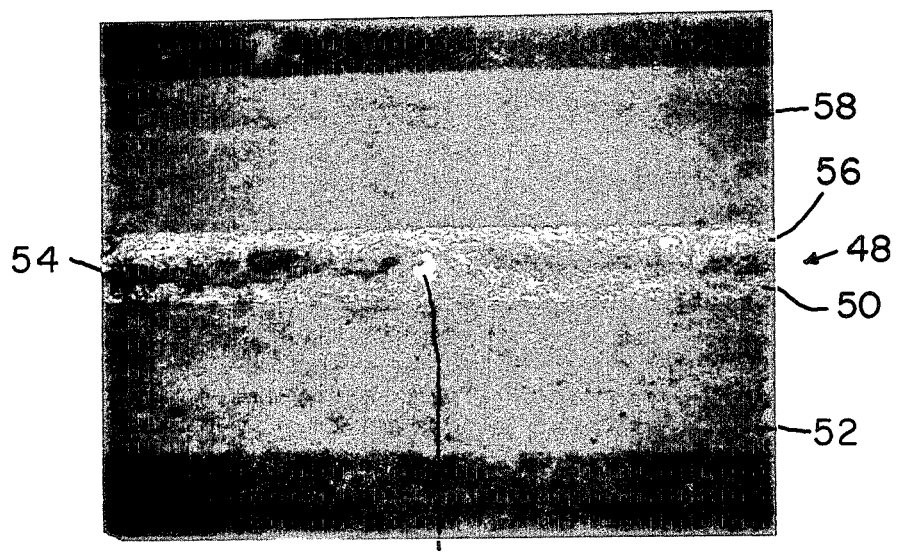
FIG. 8 is a micrograph of a cross-sectional view of a lap joint between a section of the cable of FIG. 1 and a section of cable having unmodified conductive ink thereon. The surface is magnified 200 times using an optical microscope.

FIGS. 1 and 2 show the conductive ink composition 10 deposited as a plurality of conductive traces 12 on cable substrates 14 and 16. The conductive ink composition 10 is comprised of a base ink 18 and large conductive particles and particle clusters 20. As is shown in FIG. 2, the particles are container within or partially within the ink base 18.

Generally any of the conductive inks commonly used for printed circuits by the electronics industry may be used as the ink base in this invention. These conductive inks are available from a number of companies such as E. I. DuPont de Nemours & Co., Wilmington, Del.; Achesion Colloids Co., Port Huron, Mich.; and Advanced Coatings and Chemicals Corp., Temple City, Calif. These conductive inks are comprised of a resin base and a plurality of finely divided conductive particles usually ranging in size from 15 to 20 micrometers in diameter and 0.5 to 3 micrometers thick.

A variety of large conductive particles may be used also. These particles may be made from a single metal, a base metal coated with a noble metal such as silver, gold, palladium, platinum or rhenium, a non-metallic particle coated with a noble metal, or a conductive non-metallic substance. The particles selected must, however, be compatible with the finely divided particles in the ink base. Modified ink formulations have been made with large spheroidal particles ranging in size from 15 to 90 micrometers. Particles ranging in size from 30 to 45 micrometers are used in the preferred embodiment. Generally the conductive areas or traces range in thickness from 7.6 to 38 micrometers. Modified conductive ink formulations, in accordance with the invention, have been prepared using spheroidal nickel particles coated with silver. Nickel spheroidal particles with or without a noble metal coating are available from Nova-Met Corporation, Wycoff, N.J.

Glass spheres covered with a noble metal can also be used. These spheres are available from Potters Industries, Inc., Hasbrouck Heights, N.J.

It is to be understood that the conductive particles described above are merely examples of the various types of particles that may be used to make effective modified conductive ink formulation.

The modified link formulation is made by adjusting the content of the conductive filler of the conductive ink base to contain from about 1 to about 50 volume percent large conductive particles while maintaining the original ink base resin-to-conductive filler ratio. This requires adding both large conductive particles and unfilled ink base to the conductive ink base. If the modified ink formulation is resin starved, basic ink integrity will be lost because the particles will not adhere to each other to form a continuous circuit path. If the formulation is resin rich, the particles will be too far apart to form a continuous circuit path.

FIG. 2 further shows a layer 22 of thermoplastic material deposited over the traces 12 and surface of substrate 14.

A number of thermoplastic or heat activated adhesives are available from companies such as: E. I. DuPont de Nemours & Co., Wilmington, Del. and Goodyear Tire and Rubber Co., Chemical Division, Akron, Ohio. The adhesives include but are not limited to those made from polyesters, polyamides, acrylics and polyolefins. Selection of the adhesive to be used depends primarily upon the temperature at which the adhesive softens and flows. This temperature must be sufficiently high so that the adhesive will not flow under ambient conditions but not be so high that the substrate or ink formulation will deteriorate when heat is applied. Pressure sensitive adhesives may also be used.

The thickness of the adhesive layer will be influenced to some extent by the size of the large filler particles. Generally the layer will be from 0.5 to 2 micrometers thick. The adhesive must be thick enough to cover all protruding particles thereby providing insulation for the conductors and substrate.

For example an interconnection means having a typical polyester thermoplastic adhesive 25.4 micrometers thick requires a temperature of about 130°–150° C. and a pressure of 2.1 to 35 Kg/sq.cm. for approximately 10–40 seconds for the adhesive to flow and interconnection to occur.

FIGS. 1 and 3 illustrate a lap joint 23 formed between substrates 14 and 16. As is shown in FIG. 3, corresponding traces 12 on substrates 14 and 16 are positioned in an overlapping conducting relationship with the thermoplastic layers 22 disposed between substrates 14 and 16. The interconnection is made by applying heat and pressure by conventional means 17 to one of the substrates 14 or 16 thus causing the insulating thermoplastic layers 22 to soften and flow from between corresponding traces 12 enabling the conductive particles 20 in one of the corresponding traces 12 to contact the opposing other of the corresponding positioned traces 12 thus effecting the electrical connection.

It is to be understood that the cable substrates illustrated in FIGS. 1 to 3 are representative substrates only. The invention disclosed herein can be used on flexible or rigid substrates or a combination thereof. Furthermore, the ink formulation 10 and thermoplastic insulating layer 22 may be on one surface only.

FIGS. 4 and 5 illustrate point-to-point matrix interconnects 24 wherein traces 12 on a first substrate 26 are selectively interconnected with the desired trace 12 on a second substrate 28. This type of interconnection means is particularly useful where the substrates are flexible layers and there are a number of traces or conductive areas on at least two substrates that need to be selectively interconnected. Conventional heat and pressure means 25 are applied at the desired points to effect the interconnection. As is shown in FIG. 5, thermoplastic insulating layer 22 softens and flows only from the selected point where heat and pressure have been applied. The thermoplastic dielectric layer remains between the remaining portions of substrates 26, 28 thus electrically insulating the remaining traces as they cross each other.

It is to be understood that the example used FIGS. 4 and 5 is representative only. The technique illustrated here can be used when both substrates are flexible or one substrate is flexible and the other is rigid. Furthermore, the ink formulation 10 and thermoplastic insulating layer 22 may be on one surface only. Again, depending upon the particular application heat and pressure can be applied from one or both sides of the interconnection. Point-to-point matrix interconnections permit a wide variety of interconnections between conductive areas on two or more substrates within a relatively short space.

FIG. 6 shows an alternative embodiment of the interconnecting means in which a conductive area 32 on substrate 30 made in accordance with the invention is interconnected with an exposed conductor 34 on a second substrate 36. Upon applying heat and pressure the thermoplastic layer 22 softens and becomes thinner, thus enabling the conducting particles 20 to extend through the adhesive layer 22 and make electrical connection with the exposed conductor 34. The conductor 34 on the second substrate 36 may have a composition that differs from that of the disclosed invention.

FIG. 7 illustrates a means for surface mounting a leadless electrical component 38 having conductive pads 40 thereon to substrate 42 having modified conductive ink traces 44 and thermoplastic adhesive layer 46 thereon. The thermoplastic layer 46 can be applied over the mounting area 45 only or over the entire surface of substrate 42. Upon applying heat and pressure in the mounting area 45, the thermoplastic layer 46 softens, becomes thinner and enables the conductive particles in the ink traces 40 to extend through layer 46 and make electrical connection with exposed contact pads 40. It is to be understood that the leadless electrical component is representative of the various components that can be surface mounted in accordance with the invention.

Figure 9:
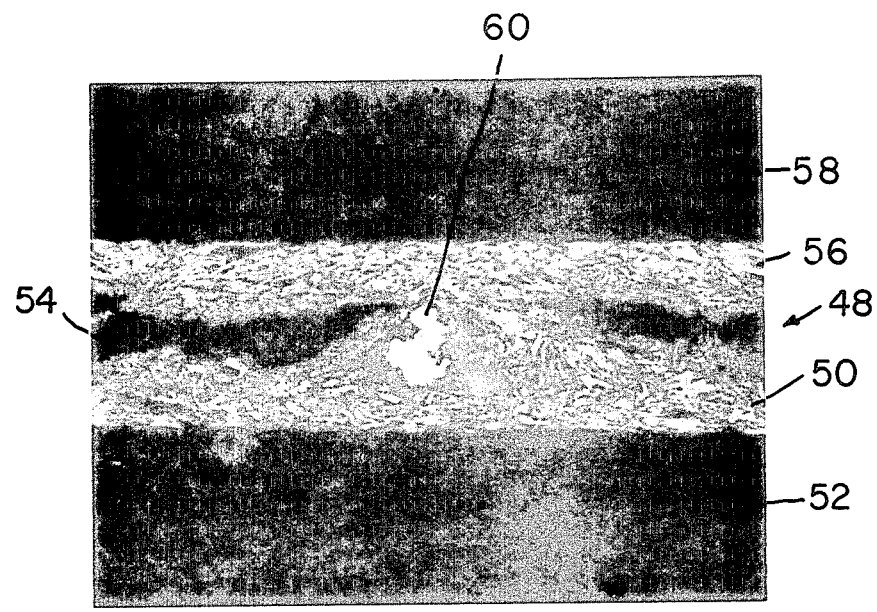
FIG. 9 is a micrograph of the section of FIG. 8 magnified 500 times.

FIGS. 8 and 9 are micrographs, magnified 200 and 300 times respectively, of a lap joint 48 formed by a modified conductive ink trace 50 on substrate 52 having thermoplastic adhesive layer 54 thereon interconnected to unmodified conductive ink 56 on substrate 58. These figures show a cluster of particles 60 in trace 50 interconnecting with conductive trace 56.

Various compositions of the modified ink formulation were tested by applying a plurality of 1.27 millimeter wide modified ink traces 20 micrometer thick on 2.54 millimeter center lines to a flexible substrate and covering the conductors and substrate with 25.4 micrometer thick layer of thermoplastic adhesive. One section of the resulting flexible cable was adhered to another cable having unmodified conductive ink traces thereon, to form a 2.54 centimeter wide lap joint.

Measurements of joint resistance were made to compare the effectiveness of various compositions of the modified ink formula.

Referring now to FIG. 10, the resistance of a path through a length of the modified conductive ink trace 50 on the first substrate 52, through the lap joint region 48 and continuing through a length of the unmodified in conductive trace 56 on the second substrate 58 equal to the length of the modified conductive ink trace utilized was measured. Three such measurements were taken at different distances of separation, $L_A$, $L_B$ and $L_C$. These resistance measurements were related to the combined trace lengths $L_T$ excluding the joint where $L_T$ equals the separation distance minus the joint length. Linear least squares analysis of the data and and independent measurement of the unmodified ink formula trace resistance allowed the values of joint resistance and resistance per unit length of the modified ink trace to be derived. These relationships are shown in FIG. 11 and in the following equations.

$$L_{Ti}=L_i-L_j$$

$$R_{TM}=(R_{T1}+R_{T2})/2$$

$$R=R_J+R_{TM}L_T$$

$$R_J=R \text{ at } L_T=0$$

$$R_{T1}=2R_{TM}-R_{T2}$$

where R is resistance, $L_T$ is trace length, i=A, B, or C, $R_{TM}$ is the mean resistance per unit length of trace, $R_{T1}$ is the resistance per unit length of the modified conductive ink trace, and $R_{T2}$ is the resistance per unit length of the unmodified conductive ink trace (independently measured).

Joint efficiency was found to be a useful parameter for comparing joint performance. Joint efficiency is defined as the measured joint conductance (reciprocal of resistance) divided by the theoretical joint conductance (reciprocal of theoretical joint resistance). The theoretical lap joint resistance depends only on the resistane per unit length of the modified conductive ink trace the unmodified conductive ink trace, and the joint length. It is independent of the number of perfectly conducting bridging elements found in a lap joint.

The following examples illustrate the invention. They are not to be construed as limitations on the instant invention except as indicated in the appended claims. All compositions are expressed as percent by volume except where specifically indicated otherwise.

EXAMPLE 1

Silver coated (15 wt% silver) nickel spheroids were obtained from Novamet, Inc., Wyckoff, N.J. A 30-45 micrometer diameter size fraction was collected by sieveing. 6.55 grams of these sorted particles and 4.40 grams of polyester resin solution KC9627 (33% solids) obtained from K. C. Coatings, Inc., Lenexa, Kan., were mixed with 100 grams of a polyester resin based conductive ink whose filler consisted of 95% silver and 5% carbon. This formed a modified conductive ink that maintained the same resin/conductive filler volume ratio as the unmodified conductive ink but its conductive filler contained 10 volume percent of the silver coated nickel spheroids. This ink was screen printed on 0.127 millimeters thick polyester film to form five 1.27 millimieters wide traces on 2.54 millimeter centers that were approximately 25.4 micrometers thick after solvent evaporation. A polyester resin solution (35 percent solids) was screen printed over the traces and intervening spaces to form an insulating layer that was approximately 12.7 to 63.5 micrometers thicker than the traces. Samples of the modified ink traces with a 2.54 centimeters section covered with the polyester layer were used to make lap joint samples. Similar traces from unmodified silver/carbon conductive ink without any insulating cover layer were registered over the covered modified ink traces for a joint length of 2.54 centimeters and bonded by applying 2.8 to 3.5 Kg/sq.cm. pressure and 149° C. for 15 seconds. Electrical resistance and insulation resistance results are shown in Table 1.

EXAMPLE 2

A sliver/carbon conductive ink was modified in a way similar to that described in Example 1 except that 1.97 grams of silver coated (12 wt% silver) glass spheres with an average diameter of 25 micrometers were substituted for the silver coated nickel spheroids. The silver coated glass spheres were obtained from Potters Industries, Inc., Hasbrouck, N.J., as their product designated S-3000S3. The resulting formulation maintained the same resin/conductive filler volume ratio as the unmodified conductive ink but its conductive filler contained 10 volume percent of the silver coated glass spheres. This modified conductive ink formulation was used to make insulated connecting traces as described in Example 1. Lap joint specimens using the insulated connecting traces and unmodified ink traces were made in a way similar to that described in Example 1. Electrical resistance and insulation resistance results are shown in Table 1.

TABLE 1

| | ADHESIVE CONNECTING TRACE JOINT PROPERTIES | | | |
|---|---|---|---|---|
| Connecting Particle Type | Resistance of Joint Region (OHMS) | Insulation Resistance (OHMS) | Modified Trace Resistance (OHMS/cm) | Unmodified Trace Resistance (OHMS/cm) |
| Silver coated nickel | .75 | $10^{10}$ | 0.449 | 0.406 |
| spheroids (Example 1) b. | .79 | $10^{10}$ | 0.437 | 0.402 |
| | .81 | $10^{10}$ | 0.441 | 0.413 |
| Average c. | .78 | $10^{10}$ | 0.441 | 0.406 |
| Silver coated glass spheres b. | 1.14 | $10^{10}$ | 0.555 | 0.524 |
| (Example 2) | 1.27 | $10^{10}$ | 0.602 | 0.539 |
| | 1.10 | $10^{10}$ | 0.571 | 0.602 |
| Average c. | 1.17 | $10^{10}$ | 0.579 | 0.555 | a. Joint Length = 2.54 cm
b. Averages for five traces
c. Averages for 3 five trace samples It is thought that the modified conductive ink formulation and interconnection means of the present invention and many of its attendant advantages will be understood from the foregoing description. It will be apparent that various changes may be made in the form, construction and arrangement of the parts thereof without departing from the spirit or scope of the invention or sacrificing all its material advantages. The form herein described is merely a preferred or exemplary embodiment thereof.

What is claimed is:

1. An electrical interconnection means of the type comprising a first insulating substrate having a plurality of conductors on one surface thereof and having an insulating adhesive in covering relationship to the conductors, the adhesive being flowable under pressure, the interconnecting means being characterized in that:
   the conductors are of conductive ink comprising an insulating polymer medium having first and second groups of conductive particles therein,
   the first group of particles are finely divided particles which are suspended in the medium and form a continuous conductive path along the length of each conductor,
   the second group of particles are agglomerates of large size particles which are randomly scattered throughout the conductive path and project above the surface of the medium, and
   the flowable adhesive extends over the surface of the insulating substrate, conductors, and projecting agglomerates to provide insulation whereby upon locating and positioning the first insulating substrate conductors in an overlapping conducting relationship to conductors on a second substrate such that the flowable adhesive is disposed between the two substrates and applying pressure to the positioned conductors and surrounding area, the adhesive flows from the positioned areas and exposes the protruding agglomerates thus bringing the exposed agglomerates into contact and electrical interconnection with the conductors on the second substrate accompanied by the adhesion of the remaining first substrate surface to the surface of the second substrate.

2. An electrical interconnection means as recited in claim 1 wherein the flowable adhesive is a thermoplastic flowable adhesive which will flow when heat and pressure are applied.

3. An electrical interconnecting means as recited in claim 1 wherein the first substrate is flexible.

4. An electrical interconnecting means as recited in claim 1 wherein the first substrate is rigid.

5. An electrical interconnecting means as recited in claim 1 wherein the finely divided particles have a major axis of approximately 15 micrometers and a minor axis of approximately 3 micrometers and the large size particles are essentially spheroidal and have a diameter ranging from 15 to 90 micrometers.

6. An electrical interconnecting means comprising:
   a first insulating member having at least one first conductive path means thereon, said first conductive path means in the form of a conductive ink including an insulating medium having a first group of finely divided conductive particles uniformly suspended and dispersed throughout said insulating medium and a second group of large size conductive particles randomly scattered throughout said insulating medium, some of the large size conductive particles projecting outwardly from said insulating medium;
   an insulating adhesive layer secured onto said first insulating member covering said at least one first conductive path means thereon;
   a second insulating member having at least one second conductive path means thereon;

said at least one first conductive path means is positioned in conducting relationship to said at least one second conductive path means, such that the adhesive layer is disposed between said first and second insulating members, and said first and second conductive path means; and said large conductive particles on said at least one first conductive path means extend through said insulating adhesive layer and make electrical connection with said at least one second conductive path means.

7. An electrical interconnection means as defined in claim 6, wherein said adhesive in said adhesive layer is a pressure sensitive adhesive which will flow when pressure is applied.

8. An electrical interconnection means as defined in claim 6, wherein said adhesive in said adhesive layer is thermoplastic flowable adhesive which will flow when heat and pressure are applied.

9. An insulating substrate comprising:
an insulating member having at least one conductive path means thereon, said conductive path means in the form of a conductive ink including an insulating medium having a first group of finely divided conductive particles uniformly suspended and dispersed throughout said insulating medium and a second group of large size conductive particles randomly scattered throughout said insulating medium, some of the large size conductive particles projecting outwardly from said insulating medium, and an insulating layer secured onto the insulating member covering the conductive path means.

10. An insulating substrate as recited in claim 9 wherein said insulating layer is a thermoplastic flowable adhesive which will flow when heat and pressure are applied.

11. An insulating substrate as recited in claim 9 wherein said insulating layer is a pressure sensitive adhesive which will flow when pressure is applied.

12. An insulating substrate as recited in claim 9 wherein the substrate is selected from the group comprised of flexible, semiflexible and rigid substrates.

13. An insulating substrate as recited in claim 9 wherein the finely divided particles have a major axis of approximately 15 micrometers and a minor axis of approximately 3 micrometers and the large size particles are essentially spheroidal and have a diameter ranging from 15 to 90 micrometers.

14. An insulating substrate as recited in claim 9 further comprising an electrical component having at least one conductive pad member thereon mounted to said insulating substrate with said at least one conductive pad electrically connected to said at least one conductive path means, said at least one conductive pad being positioned in conducting relationship to said at least one conductive path means such that the adhesive layer is between said pad member and said path means; and said large conductive particles on said at least one conductive path means extend through said adhesive layer and make electrical connection with said at least one conductive pad member.

15. An insulating substrate as defined in claim 14 wherein said adhesive in said adhesive layer is a pressure sensitive adhesive which will flow when pressure is applied.

16. An insulating substrate as defined in claim 14 wherein said adhesive in said adhesive layer is thermoplastic flowable adhesive which will flow when heat and pressure are applied.

17. An adhesive electrical interconnection cable comprised of:
an insulating continuous flexible strip having at least one conductive path means thereon, said conductive path means being in the form of a conductive ink including an insulating medium having a first group of finely divided conductive particles uniformly suspended and dispersed throughout said insulating medium and a second group of large size conductive particles randomly scattered throughout said insulating medium, some of the large size conductive particles, projecting outwardly from said insulating medium, and an insulating thermoplastic flowable adhesive layer secured onto said flexible strip and covering said conductive path means.

18. An adhesive electrical interconnecting cable comprised of:
an insulating continuous flexible strip having at least one conductive path means thereon, said conductive path means being in the form of a conductive ink including an insulating medium having a first group of finely divided conductive particles uniformly suspended and dispersed throughout said insulating medium and a second group of large size conductive particles randomly scattered throughout said insulating medium, some of the large size conductive particles, projecting outwardly from said insulating medium, and an insulating pressure sensitive flowable adhesive layer secured onto said flexible strip and covering said conductive path means.

19. An interconnection means made in accordance with the method comprised of the steps of:
selecting a first insulating member;
applying at least one conductive path to said first insulating member, said conductive path being in the form of a conductive ink including an insulating medium having a first group of finely divided conductive particles uniformly suspended and dispersed throughout said insulating medium and a second group of large size conductive particles randomly scattered throughout said insulating medium, some of said large size conductive particles projecting outwardly from said insulating member;
applying an insulating pressure sensitive adhesive layer secured onto said first insulating member covering said at least one conductive path;
positioning said at least one conductive path in a conducting relationship with at least one conductive means on a second insulating member such that said pressure sensitive adhesive layer is disposed between said at least one conductive path and said at least one conductive means;
applying pressure to the positioned at least one conductive path and at least one conductive means causing said pressure sensitive adhesive to flow and become thinner thus causing said large conductive particles on said at least one conductive path to extend through said pressure sensitive adhesive layer and make electrical connection with said at least one conductive means.

20. An electrical interconnection means as recited in claim 19 wherein said second insulating member is a leadless electrical component having at least one conductive pad thereon.

* * * * *